(12) United States Patent
Tan et al.

(10) Patent No.: US 8,161,357 B2
(45) Date of Patent: Apr. 17, 2012

(54) SYSTEMS AND METHODS FOR USING INTRINSIC DATA FOR REGENERATING DATA FROM A DEFECTIVE MEDIUM

(75) Inventors: Weijun Tan, Longmont, CO (US);
Shaohua Yang, Santa Clara, CA (US);
George Mathew, San Jose, CA (US);
Kelly Fitzpatrick, Sudbury, MA (US);
Hao Zhong, San Jose, CA (US); Yuan Xing Lee, San Jose, CA (US)

(73) Assignee: AGERE Systems Inc., Allentown, PA (US)

( * ) Notice: Subject to any disclaimer, the term of this patent is extended or adjusted under 35 U.S.C. 154(b) by 1023 days.

(21) Appl. No.: 12/111,867

(22) Filed: Apr. 29, 2008

(65) Prior Publication Data
US 2009/0235146 A1 Sep. 17, 2009

Related U.S. Application Data

(60) Provisional application No. 61/037,019, filed on Mar. 17, 2008.

(51) Int. Cl.
*H03M 13/00* (2006.01)
(52) U.S. Cl. ........ 714/780; 714/795; 714/799; 714/786; 714/746; 714/751; 714/792; 714/794
(58) Field of Classification Search .................... None
See application file for complete search history.

(56) References Cited

U.S. PATENT DOCUMENTS

| | | | |
|---|---|---|---|
| 5,815,507 A * | 9/1998 | Vinggaard et al. | 714/704 |
| 6,065,149 A | 5/2000 | Yamanaka | |
| 6,269,124 B1 * | 7/2001 | Nagayasu et al. | 375/262 |
| 6,691,263 B2 | 2/2004 | Vasic et al. | |
| 6,738,948 B2 | 5/2004 | Dinc et al. | |
| 6,965,652 B1 * | 11/2005 | Burd et al. | 375/341 |
| 6,980,382 B2 | 12/2005 | Hirano et al. | |
| 7,154,936 B2 | 12/2006 | Bjerke et al. | |
| 7,168,030 B2 | 1/2007 | Aryoshi | |
| 7,203,015 B2 | 4/2007 | Sakai et al. | |
| 7,237,173 B2 | 6/2007 | Morita et al. | |
| 7,254,192 B2 | 8/2007 | Onggosanusi | |
| 7,257,172 B2 | 8/2007 | Okamoto et al. | |
| 7,359,313 B2 | 4/2008 | Chan et al. | |

(Continued)

OTHER PUBLICATIONS

Kavcic et al., "A Signal-Dependent Autoregressive Channel Model", IEEE Transactions on Magnetics, vol. 35, No. 5, Sep. 1999 pp. 2316-2318.

*Primary Examiner* — John Trimmings

(74) *Attorney, Agent, or Firm* — Hamilton, DeSanctis & Cha

(57) ABSTRACT

Various embodiments of the present invention provide systems and methods for data regeneration. For example, a system for data regeneration is disclosed that includes a data input derived from the medium. A data detector and a data recovery system receive the data input. The data detector provides a first soft output, and the data recovery system provides a second soft output. The first soft output and the second soft output are provided to a multiplexer. A media defect detector performs a media defect detection process, and provides a defect flag that indicates whether the data input is derived from a defective portion of the medium. The defect flag is provided to the multiplexer where it is used to select whether the first soft output or the second soft output is provides as an extrinsic output.

39 Claims, 11 Drawing Sheets

U.S. PATENT DOCUMENTS

| | | |
|---|---|---|
| 7,441,174 B2 | 10/2008 | Li et al. |
| 7,688,915 B2 | 3/2010 | Tanrikulu |
| 7,801,254 B1 * | 9/2010 | Burd et al. .................... 375/341 |
| 2003/0063405 A1 | 4/2003 | Jin et al. |
| 2007/0061687 A1 * | 3/2007 | Hwang ........................ 714/780 |
| 2009/0235116 A1 | 9/2009 | Tan et al. |
| 2009/0235146 A1 | 9/2009 | Tan et al. |
| 2009/0268575 A1 | 10/2009 | Tan et al. |
| 2009/0268848 A1 | 10/2009 | Tan et al. |
| 2009/0271670 A1 | 10/2009 | Tan et al. |
| 2010/0042877 A1 | 2/2010 | Tan |

* cited by examiner

SYSTEMS AND METHODS FOR USING INTRINSIC DATA FOR REGENERATING DATA FROM A DEFECTIVE MEDIUM

CROSS REFERENCE TO RELATED APPLICATIONS

The present application claims priority to (is a non-provisional of) U.S. Provisional Patent Application No. 61/037,019 entitled "Systems and Methods for Using Intrinsic Data for Regenerating Data from a Defective Medium", and filed Mar. 17, 2008 by Tan et al. The entirety of the aforementioned application is incorporated herein by reference for all purposes.

BACKGROUND OF THE INVENTION

The present inventions are related to systems and methods for transferring information, and more particularly to systems and methods for obtaining data from defective media associated with a data transfer.

Various data transfer systems have been developed including storage systems, cellular telephone systems, radio transmission systems. In each of the systems data is transferred from a sender to a receiver via some medium. For example, in a storage system, data is sent from a sender (i.e., a write function) to a receiver (i.e., a read function) via a storage medium. The effectiveness of any transfer is impacted by any defects associated with the transfer medium. In some cases, data loss caused by defects in the transfer medium (e.g., a physical defect or noise associated therewith) can make recovery of data from the transfer medium difficult even for data received from non-defective areas or times.

Various approaches have been developed for identifying defects in a transfer medium. In such systems, the identification of a potential defect causes a resulting nullification of any data derived from a given defective area of a medium. By nullifying the data, errors are not allowed to propagate through later processing steps. Turning to FIG. 1, an example of a system 100 capable of nullifying data is depicted. System 100 includes a digital filter (DFIR) 115 that receives a media data input 105 and provides a filtered version of media input 105 to a detector 120. Detector 120 performs a data detection algorithm and provides an output 170 that includes both a soft output and a hard output. In addition, system 100 includes a defect detector 110 that is operable to identify a period when the medium from which media data input 105 is derived is possibly defective. When a potentially defective region is identified, an output 112 is asserted high causing a multiplexer 125 to select a nullified data set 160 to replace output 170 from detector 120. The output of multiplexer 125 is provided to an interleaver 130 that interleaves the data and provides the interleaved data to a decoder 140. Decoder 140 performs a decoding algorithm on the data and provides a data output 150. In some cases, data output 150 is de-interleaved using a de-interleaver 135 and fed back to detector 120 where it is reprocessed on a subsequent iteration. While system 100 provides for nullifying data derived from a potentially defecting region of a medium thereby reducing the possibility of error propagation, it fails to obtain any data from the defective region. In some cases, this is not acceptable as data from the defective region may be highly desirable for one reason or another.

Hence, for at least the aforementioned reasons, there exists a need in the art for advanced systems and methods for obtaining data from potentially defective media.

BRIEF SUMMARY OF THE INVENTION

The present inventions are related to systems and methods for transferring information, and more particularly to systems and methods for obtaining data from defective media associated with a data transfer.

Various embodiments of the present invention provide methods for regenerating data derived from a defective portion of a medium. Such methods include receiving a data input derived from a medium, and performing a data detection based at least in part on the data input. The data detection generates a first soft output. A defect status of the medium is determined, and based at least in part on the defect status, a regenerated signal is decoded in place of the first soft output. The decoding process provides a second soft output. Producing the regenerated data signal includes the second soft output multiplied by a scalar. In some instances of the aforementioned embodiments, decoding the regenerated signal includes interleaving the regenerated signal to produce an interleaved first soft output, decoding the interleaved first soft output to created a decoded output, and de-interleaving the decoded output to produce the second soft output.

Yet other embodiments of the present invention provides systems for regenerating data derived from a defective portion of a medium. Such systems include a data input that is derived from a medium, a data detector that receives the data input and provides a first soft output, a decoder that decodes a second soft output and generates a third soft output, a data regeneration system that multiplies the third soft output by a scalar to create a fourth soft output, a media defect detector that receives the data input and provides a defect flag indicative of a defect status of the medium, and an input selector that provides either the first soft output or the fourth soft output as the second soft output based at least in part on the defect flag. In some instances of the aforementioned embodiments, the data detector, the data regeneration system and the input selector are implemented together as a branch metric modified data detector. In such cases, the branch metric modified data detector receives the data input and the defect flag, and utilizes the fourth soft output as a branch metric whenever the defect flag indicates a defective portion of the medium associated with the data input. In one particular instance of the aforementioned embodiments, the branch metric is mathematically (1+the scalar)*(the third soft output).

Various other embodiments of the present invention provide methods for regenerating data derived from a defective portion of a medium. Such methods include decoding an intrinsic input to generate an extrinsic output. Further, the methods further include receiving a data input derived from a medium, performing a data detection on the data input to generate a first soft output, and performing a data regeneration process on the data input and the intrinsic input to generate a second soft output. A defect status of the medium is determined, and either the first soft output or the second soft output are provided as the extrinsic output based at least in part on the determination of the defect status of the medium. The equalizer may be, but is not limited to, a full response equalizer, a zero force equalizer, or an MMSE equalizer. The data detection may be performed by, but is not limited to, a soft output noise predictive maximum likelihood detector. The medium may be, but is not limited to, a magnetic storage medium, a wireless communication channel, or a wired communication channel. As used herein, the terms "intrinsic" and "extrinsic" are used in their general sense. In general, blocks include both an extrinsic input and an extrinsic output. In various cases, the extrinsic output from one block may be the intrinsic input of another block. Similarly, where a block that feeds information back to itself, an extrinsic output from the block may be the intrinsic input to the same block.

In some instances of the aforementioned embodiments, the data recovery system includes an equalizer and a soft LLR estimator. The equalizer provides an equalized output indicating a polarity of the data input, and the soft LLR estimator multiplies the equalized output by a scalar value and provides a third soft output. In some cases, the scalar value is one of two scalar values. In such cases, the data recovery system further includes a multiplier that multiplies the intrinsic input with another scalar value to create an output scalar. The data recovery system further includes an adder that sums the third soft output with the output scalar to generate the second soft output. In particular instances of the aforementioned embodiments, the data input is precoded.

In various instances of the aforementioned embodiments, the data recovery system further includes a two state MAP deprecoder that receives the third soft output and the intrinsic input, and deprecodes the third soft output and the intrinsic input to generate a fourth soft output. In some such instances, the scalar value is one of two scalar values. In such instances, the data recovery system further includes a multiplier that multiplies the intrinsic input with a second scalar value to create an output scalar, and an adder that sums the fourth soft output with the output scalar to generate the second soft output. As used herein, the phrase "two state MAP decoder" is used in its broadest sense to mean any two state convolutional code decoder including, but not limited to, a maximum a posteriori decoder or a soft output Viterbi algorithm decoder.

Other embodiments of the present invention provide systems for regenerating data derived from a defective portion of a medium. Such systems include a decoder that decodes an intrinsic input and generates an extrinsic output. The systems further include a data input that is derived from a medium and provided to a data detector and a data recovery system. The data detector receives the data input and generates a first soft output based at least in part on the data input. The data recovery system receives the data input and the intrinsic input, and generates a second soft output based at least in part on the data input and the intrinsic input. The systems further include a multiplexer that provides either the first soft output or the second soft output as the extrinsic output based at least in part on an indication of a defect in the medium.

In some such instances, the data recovery system includes an equalizer that provides an equalized output indicating a polarity of the data input. In some cases, the data recovery system further includes a soft estimator that receives the equalized output and provides a third soft output corresponding to the equalized output. In some cases, the soft estimator multiplies the equalized output by a scalar value. In particular cases, the scalar is one of two scalars. The data recovery system further includes a multiplier that multiplies the intrinsic input with another scalar value to create an output scalar, and an adder that sums the third soft output with the output scalar to generate the second soft output.

In various instances of the aforementioned embodiments, the data input is precoded. In such instances, the data recovery system further includes a two state MAP deprecoder that receives the third soft output and the intrinsic input, and deprecodes the third soft output and the intrinsic input to generate a fourth soft output. In such cases, the data recovery system further includes a multiplier that multiplies the intrinsic input with a scalar value to create an output scalar, and an adder that sums the fourth soft output with the output scalar to generate the second soft output.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for transferring information, and more particularly to systems and methods for obtaining data from defective media associated with a data transfer.

Media defect detection is a key operation in a magnetic recording system. If not appropriately handled, data derived from an undetected region of a medium can degrade or even disable such a magnetic recording system. This is particularly true for a read channel using iterative decoding. It should be noted that while various embodiments of the present invention are described in relation to a magnetic recoding channel, various embodiments of the present invention may be applied to other types of channels including, but not limited to, communication channels. Embodiments of the present invention provide mechanisms for reducing the possibility of propagating errors from a potentially defective portion of a medium as indicated by a media defect detector. In the embodiments, the data from the potentially defective medium is not simply nullified, but rather is manipulated to salvage at least some indication of the original data written to the medium. This indicia of the original data written to the medium may be used in subsequent iterations of a detection and decoding process that aid in recovering the data from the potentially defective region of the medium. While such embodiments have been describes as being particularly applicable to magnetic recording systems, one of ordinary skill in the art will recognize other systems such as, for example, communication systems to which data recovery in accordance with one or more embodiments of the present invention may be applied. Some embodiments of the present invention use techniques to improve the correction of data derived from a defective portion of a medium or channel. In some such embodiments, otherwise wasted data derived from a defective portion of a channel is re-equalized to full response. By doing so, the obtained residue may be at least partially utilized to correct and/or recover data derived from a defective portion.

Figure 2:
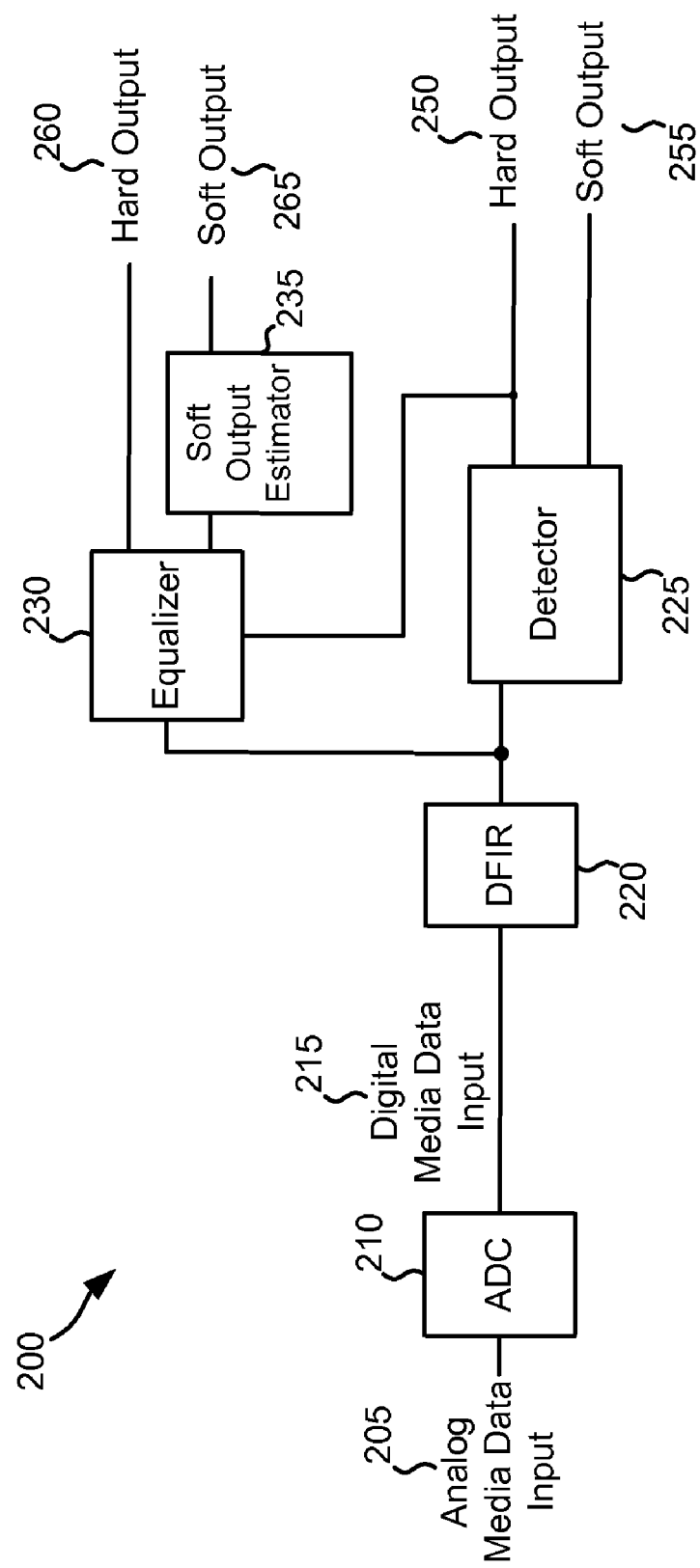
FIG. 2 a data recovery system that may be used in relation to various embodiments of the present invention.

Turning to FIG. 2, a data recovery system 200 that may be used in relation to various embodiments of the present invention is shown. Data recovery system 200 includes an analog to digital converter 210 that receives an analog media data input 205 and converts it to a corresponding digital media data input 215. Analog to digital converter 210 may be any circuit known in the art that is capable of receiving an analog signal and converting the analog signal to a digital signal. Analog media data input 205 is an analog data signal derived from some medium. The medium may be, but is not limited to, a magnetic storage medium, a wireless communication channel, a wired communication channel, or the like. Based on the disclosure provided herein, one of ordinary skill in the art will recognize a variety of media from which analog media data input (or a digital media data input) may be derived. Digital media data input 215 is provided to a digital filter 220 (DFIR) as is known in the art.

The output of digital filter 220 is provided to a detector 225 and to an equalizer 230. Detector 225 may be any detector known in the art including, but not limited to, a soft output viterbi algorithm (SOVA) detector or a maximum a posteriori (MAP) detector. Detector 225 provides both a hard output 250 and a soft output 255. Equalizer 230 provides a hard output 260. A soft output estimator 235 provides a soft output 265 that corresponds to hard output 260 and is reduced substantially to recognize the reduced probability of the accuracy of equalizer 230 when a media defect flag (not shown) is asserted. The media defect flag may be asserted whenever a potential defect is detected related to a medium from which analog media data input 205 is derived. The media defect flag may be asserted by any media defect detector known in the art. Exemplary media defect detectors are disclosed in PCT Patent Application No. PCT/US07/80043 entitled "Systems and Methods for Media Defect Detection" and filed on Oct. 1, 2007 by Agere Systems Inc. The entirety of the aforementioned patent application is incorporated herein by reference for all purposes. It should be noted that other types a media defect detection may be used in relation to the various embodiments of the present invention. In one particular embodiment of the present invention, soft output estimator 235 may simply provide a hardwired value representing a relatively low probability of accuracy of hard output 260. As an example, the hardwired soft output may represent, for example, a twenty-five percent probability of accuracy. Based on the disclosure provided herein, one of ordinary skill in the art will recognize a variety of probabilities that may be generated by soft output estimator 235 in accordance with different embodiments of the present invention.

Figure 3:
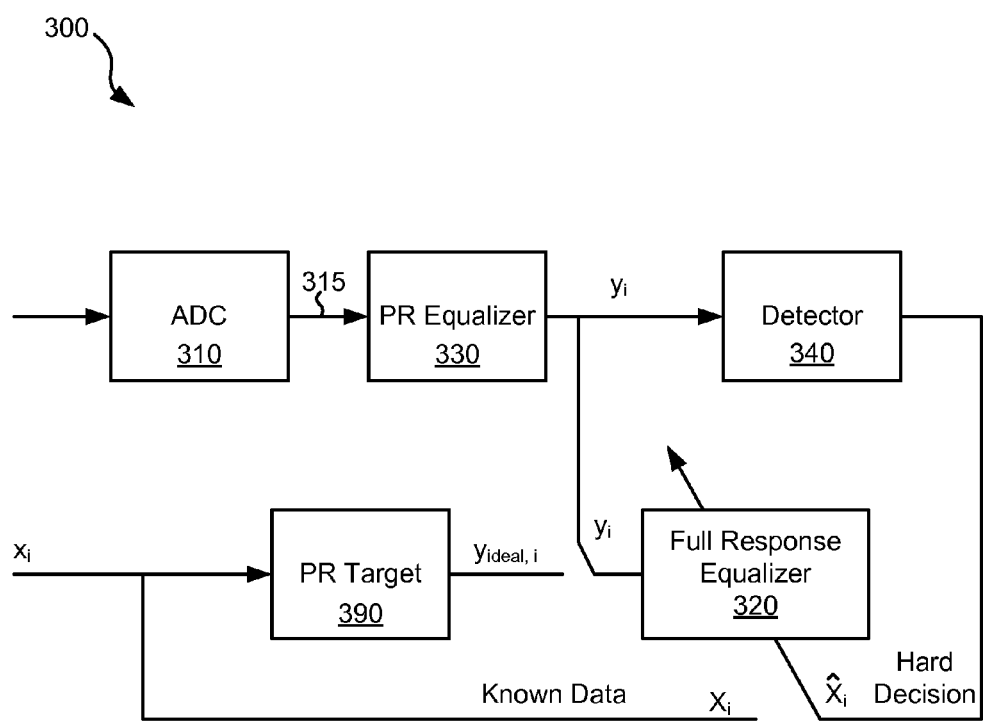
FIG. 3 depicts a full response re-equalization circuit that may be used in relation to various embodiments of the present invention.

In some particular embodiments of the present invention, equalizer 230 may utilize a full response equalization circuit. Turning to FIG. 3, an example of such a full response re-equalization circuit 320 is shown in relation to a magnetic recording channel 300. An output 315 of an analog-to-digital converter 310 is first equalized to a pre-set PR target using a PR equalizer 330. PR equalizer may be implemented as a DFIR. PR equalizer 330 is adaptive and may be driven by a first noise predictive maximum likelihood (NPML) detector 340 to yield a hard decision, $\hat{x}_i$. As shown in FIG. 3, full-response equalizer 320 is added upon PR equalizer 330. Full-response equalizer 320 can also be driven by NPML detector 340 via hard decision $\hat{x}_i$. In addition, a known data training mode using a PR target 390 is also available which uses know data, $x_i$, and $y_{ideal,i}$ to adapt the equalizer. Such a full response equalization circuit may be used to remove or reduce inter-symbol interference (ISI) and is capable of deriving meaningful information from digital media data input 215 at times when a media defect is indicated. In particular, such a full response equalizer is capable of deriving the polarity of a signal with some reasonable level of accuracy. During such times, detector 225 is not capable of providing meaningful information from digital media data input 215. Thus, some embodiments of the present invention replace the output from detector 225 with the polarity data from equalizer 230. During times when a media defect is not indicated, the output from detector 225 is used as it contains not only reasonably accurate polarity information, but also reasonably accurate magnitude information.

In another particular embodiment of the present invention, equalizer 230 is a zero force equalizer (ZFE) as are known in the art that attempts to remove inter-symbol interference (ISI) and is capable of deriving meaningful information from digital media data input 215 at times when a media defect is indicated. In particular, such a zero force equalizer is capable of deriving the polarity of a signal with some reasonable level of accuracy. During such times, detector 225 is not capable of providing meaningful information from digital media data input 215. Thus, some embodiments of the present invention replace the output from detector 225 with the polarity data from equalizer 230. During times when a media defect is not indicated, the output from detector 225 is used as it contains not only reasonably accurate polarity information, but also reasonably accurate magnitude information.

The aforementioned zero force equalizer provides hard output 260 that is represented by the following equation:

$$z_i = \sum_{k=-K}^{K} y_{i-k} w_k = q_0 x_i + \sum_{k=-K(k\neq 0)}^{M+K-1} q_k x_{i-k} + \sum_{k=-K}^{K} w_k n_{i-k},$$

where $n_i$ is the overall noise, and the zero forcing filter is $w = [w_{-K}, w_{-K+1}, \ldots, w_{K-1}, w_K]$. The equalizer output is minimized by forcing the equalizer response to the following:

$$q_k = \begin{cases} 1, & k = 0 \\ 0, & k \neq 0 \end{cases},$$

which is commonly known as the zero force equalizer criterion. By imposing the following condition $E\{(x_i-z_i)x_{i-k}\}0$, the zero force equalizer can be implemented as follows:

$$w_K^{i+1} = w_k^i + \Delta(x_i - z_i)x_{i-k}, \; i = 0, 1, 2$$

In a decision driven mode, $x_i$ is unknown and can be replaced by decision $\hat{x}_i$.

In yet another particular embodiment of the present invention, equalizer 230 is a minimum mean-square error (MMSE) equalizer as are known in the art that attempts to remove inter-symbol interference (ISI) and is capable of deriving meaningful information from digital media data input 215 at times when a media defect is indicated. In particular, such an MMSE equalizer is capable of deriving the polarity of a signal with some reasonable level of accuracy. During such times, detector 225 is not capable of providing meaningful information from digital media data input 215. Thus, some embodiments of the present invention replace the output from detector 225 with the polarity data from equalizer 230. During times when a media defect is not indicated, the output from detector 225 is used as it contains not only reasonably accurate polarity information, but also reasonably accurate magnitude information.

The aforementioned MMSE equalizer uses the following criterion to minimize:

$$J = E\{|x_i - z_i|^2\} = E\left\{\left|x_i - \sum_{k=-K}^{K} y_{i-k} w_k\right|^2\right\}.$$

The aforementioned criterion is used in place of that described above in relation to zero force equalization. Of note, the desired output, $x_i$, indicates this is a full-response equalizer. Accordingly, the adaptation is different that described above in relation to zero force equalization, and is written as follows:

$$w_k^{i+1} = w_k^i + \Delta(x_i - z_i) y_{i-k}, \ i=0,1,2,$$

Figure 4A:
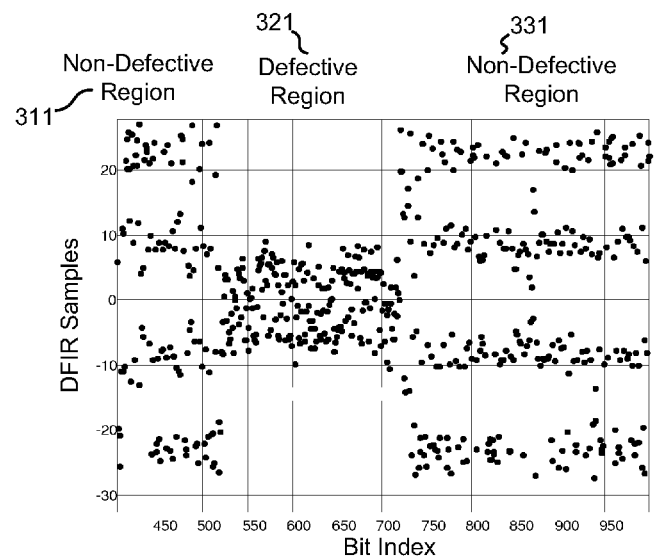
FIGS. 4a-4b depicts exemplary data plots showing a defective media region, DFIR samples and ZFE samples that aid in discussion of the various embodiments of the present invention.
Figure 4B:
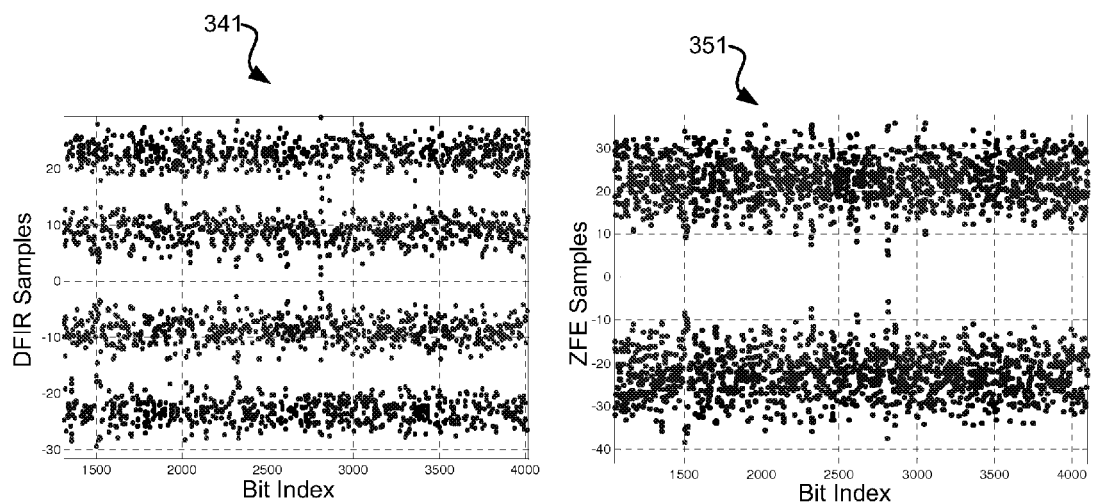

Turning to FIGS. 4a-4b, exemplary data plots show a defective media region, DFIR samples and ZFE samples that aid in discussion of the various embodiments of the present invention. It should be noticed that while these figures depict exemplary results achievable using a zero force equalizer in place of equalizer 230, similar exemplary results may be achieved through use of full response equalization or MMSE equalization as described above. First, turning to FIG. 4a, the output of filter 220 are shown for three distinct regions of a medium from which analog media data input 205 is derived: (1) an initial non-defective region 311, (2) a subsequent non-defective region 331, and (3) an intervening defective region 321. As shown, the output of filter 220 provides good four level differentiation (i.e., a two tap partial response) during non-defective regions 311, 331. In contrast, during defective region 321, the signals become very difficult to differentiate. This inability to differentiate typically renders the output of detector 225 highly inaccurate. Turning to FIG. 4b, a plot 341 of the output of filter 220 is shown that corresponds to that shown in non-defective regions 311, 331. Another plot 351 shows the output of equalizer 230 (i.e., a single tap target). The output of plot 351 provides similar polarity information for both defective region 321 and non-defective regions 311, 331. As shown by plot 341, the output of digital filter 220 provides some reasonable information about the data received from defective region 321, albeit not as rich as the information available from detector 225 during non-defective regions 311, 331.

Figure 5:
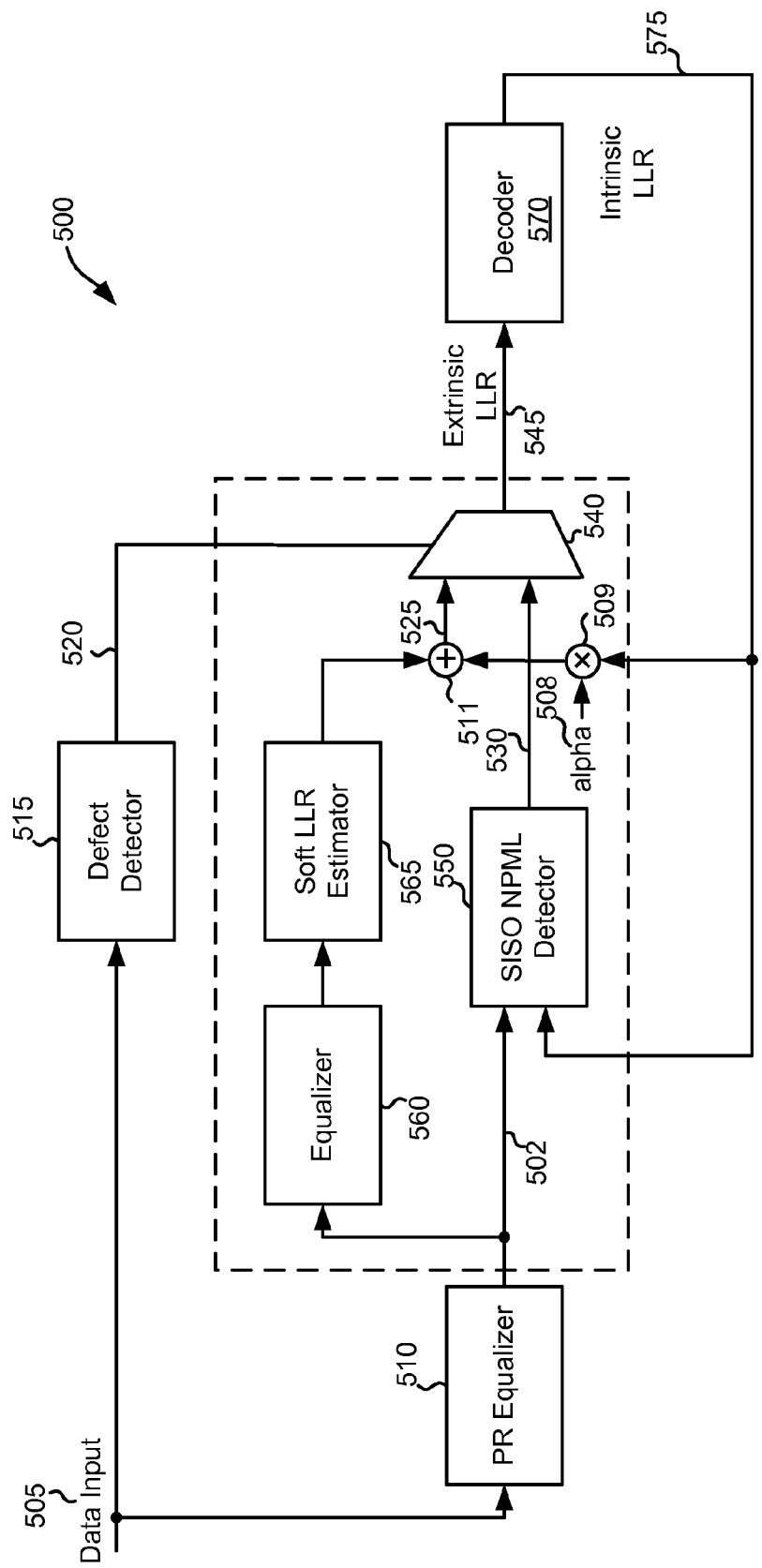
FIG. 5 shows a data regeneration system in accordance with one or more embodiments of the present invention.

Turning to FIG. 5, a data regeneration system 500 operating on a non-precoded channel is depicted in accordance with various embodiments of the present invention. Of note, only the decoding side of the circuit is depicted and it is understood that an encoder and medium would exist from which a data input 505 is derived. Data regeneration system 500 includes data input 505 that may be received, for example, from an analog to digital converter (not shown). Data input 505 is provided to a PR equalizer 510 as is known in the art (PR equalizer may be implemented as a DFIR), and to a defect detector 515 as is known in the art. Defect detector 515 may be operable to determine that a medium from which data input 505 is derived has a defective region. When a defective region is detected, defect detector 515 asserts a media defect flag 520 that controls selection of a multiplexer 540. Multiplexer 540 provides an extrinsic log likelihood ratio (LLR) 545 to a decoder 570. In some cases, decoder 570 is a low density parity check (LDPC) decoder as is known in the art. In particular, when media defect flag 520 is asserted such that a defective portion of a medium from which data input 505 is indicated, an output 525 is selected. In contrast, when media defect flag 520 is asserted such that a media defect is not indicated, output 530 is selected.

As some examples, defect detector 515 may be defect detector similar to those disclosed in PCT Patent Application No. PCT/US07/80043 entitled "Systems and Methods for Media Defect Detection" and filed on Oct. 1, 2007 by Agere Systems Inc. The entirety of the aforementioned patent application was previously incorporated herein by reference for all purposes. It should be noted that other types a media defect detection may be used in relation to the various embodiments of the present invention.

Output 530 is driven by a soft output detector 550 as are known in the art, and output 525 are driven by an equalizer 560 that may be similar to those described above. In one particular embodiment of the present invention, equalizer 560 is a zero force equalizer similar to that described above. An output 502 of PR equalizer 510 is provided to both soft output detector 550 and equalizer 560. Soft output detector 550 performs a detection algorithm on the received input and provides output 530 as is known in the art. Output 530 provides at least a soft indication of the original data that was previously encoded and from which data input 505 is derived. When the medium from which data input 505 is derived is non-defective, output 530 provides a reasonably accurate representation of the originally encoded data. In contrast, when the medium from which data input 505 is derived is defective, output 530 becomes less accurate and in some cases the decreased accuracy results in an inability for decoder 570 to operate properly. An intrinsic LLR output 575 from decoder 570 is fed back to soft output detector 550 to be used as an intrinsic LLR input on the next iteration.

Because the inaccuracy of output 530 becomes problematic for decoder 570 during times when a media defect is detected, output 525 is selected to drive extrinsic LLR 545 in place of output 530 during such times. Output 525 is driven by a separate, parallel data path providing equalization. In particular, equalizer 560 performs an equalization on output 502 that yields useful polarity information by removing inter-symbol interference. The output of equalizer 560 is provided to a soft LLR estimator 565 that is used to convert the equalized samples from equalizer 560 to an LLR. In some cases, soft LLR estimator 565 is a scalar β that scales an input $z_i$ down to obtain an output $\Lambda_i$. Said another way, soft LLR estimator 565 provides a soft output comparable to that provided by soft output detector 550, albeit a soft output indicating a generally reduced probability of accuracy when compared with that available from soft output detector 550 when a media defect is not indicated. In some cases, the output from soft LLR estimator 565 may be provided directly to multiplexer 540 to be used in place of output 530 when a media defect is detected.

In some cases such as the case that is shown, intrinsic LLR 575 may be used to further massage the output of soft LLR estimator 565. In particular, intrinsic LLR 575 is multiplied by a multiplier 508 (alpha) using a multiplier 509. The product of multiplier 509 is added to the output of soft LLR estimator 565 using an adder 511. The product of adder 511 is output 525. Where such is the case, the following equation describes the extrinsic LLR 545 (i.e., the soft input) that is provided to decoder 570:

$$\Lambda_{ldpc,a}^{j+1}(x_i) = \begin{cases} \Lambda_{ch,ext}^{j}(x_i), & \text{where defect flag 520 does not indicate a defect} \\ \beta \cdot z_i + \alpha \cdot \Lambda_{ldpc,ext}^{j}(x_i), & \text{where defect flag 520 indicates a defect.} \end{cases}$$

It should be noted that regardless of whether output 525, output 530, or the output of soft LLR estimator 565 is chosen to drive extrinsic LLR 545, decoder 570 may apply the same decoding process. In some cases, the decoding process is a standard LDPC decoding process.

Figure 6:
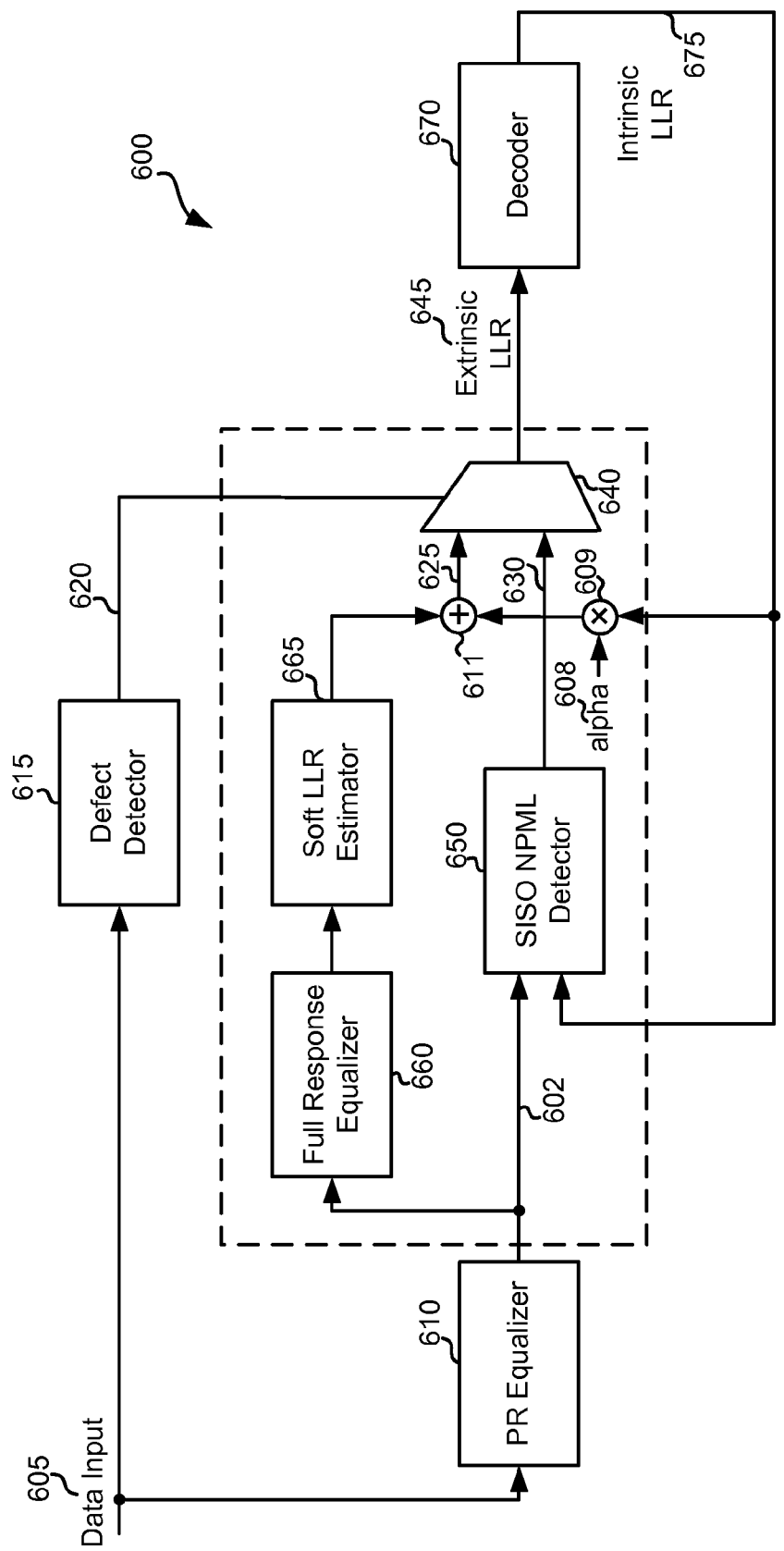
FIG. 6 shows another data regeneration system in accordance with one or more embodiments of the present invention.

Turning to FIG. 6, a data regeneration system 600 operating on a non-precoded channel is depicted in accordance with various embodiments of the present invention. Of note, only the decoding side of the circuit is depicted and it is understood that an encoder and medium would exist from which a data input 605 is derived. Data regeneration system 600 includes data input 605 that may be received, for example, from an analog to digital converter (not shown). Data input 605 is provided to a PR equalizer 610 as is known in the art, and to a defect detector 615 as is known in the art. Defect detector 615 may be operable to determine that a medium from which data input 605 is derived has a defective region. When a defective region is detected, defect detector 615 asserts a media defect flag 620 that controls selection of a multiplexer 640. Multiplexer 640 provides an extrinsic log likelihood ratio (LLR) 645 to a decoder 670. In some cases, decoder 670 is a low density parity check (LDPC) decoder as is known in the art. In particular, when media defect flag 620 is asserted such that a defective portion of a medium from which data input 605 is indicated, an output 625 is selected. In contrast, when media defect flag 620 is asserted such that a media defect is not indicated, output 630 is selected.

As some examples, defect detector 615 may be defect detector similar to those disclosed in PCT Patent Application No. PCT/US07/80043 entitled "Systems and Methods for Media Defect Detection" and filed on Oct. 1, 2007 by Agere Systems Inc. The entirety of the aforementioned patent application was previously incorporated herein by reference for all purposes. It should be noted that other types a media defect detection may be used in relation to the various embodiments of the present invention.

Output 630 is driven by a soft output detector 650 as are known in the art, and output 625 are driven by a full response equalizer 660 that may be similar to those described above. In one particular embodiment of the present invention, full response equalizer 660 is a 6-tap FIR filter. An output 602 of PR equalizer 610 is provided to both soft output detector 650 and full response equalizer 660. Soft output detector 650 performs a detection algorithm on the received input and provides output 630 as is known in the art. Output 630 provides at least a soft indication of the original data that was previously encoded and from which data input 605 is derived. When the medium from which data input 605 is derived is non-defective, output 630 provides a reasonably accurate representation of the originally encoded data. In contrast, when the medium from which data input 605 is derived is defective, output 630 becomes less accurate and in some cases the decreased accuracy results in an inability for decoder 670 to operate properly. An intrinsic LLR output 675 from decoder 670 is fed back to soft output detector 650 to allow for iterative processing.

As the inaccuracy of output 630 becomes problematic for decoder 670 during times when a media defect is detected, output 625 is selected to drive extrinsic LLR 645 during such times. Output 625 is driven by a separate, parallel data path providing full response equalization. In particular, full response equalizer 660 performs an equalization on output 602 that yields useful polarity information by removing inter-symbol interference. The output of full response equalizer 660 is provided to a soft LLR estimator 665 that is used to convert the equalized samples from full response equalizer 660 to an LLR. In some cases, soft LLR estimator 665 is a scalar $\beta$ that scales an input $z_i$ down to obtain an output $\Lambda_i$. Said another way, soft LLR estimator 665 provides a soft output comparable to that provided by soft output detector 650, albeit a soft output indicating a generally reduced probability of accuracy when compared with that available from soft output detector 650 when a media defect is not indicated. In some cases, the output from soft LLR estimator 665 may be provided directly to multiplexer 640 to be used in place of output 630 when a media defect is detected.

In some cases such as the case that is shown, intrinsic LLR 675 may be used to further massage the output of soft LLR estimator 665. In particular, intrinsic LLR 675 is multiplied by a multiplier 608 (alpha) using a multiplier 609. The product of multiplier 609 is added to the output of soft LLR estimator 665 using an adder 611. The product of adder 611 is output 625. Where such is the case, the following equation describes the extrinsic LLR 645 (i.e., the soft input) that is provided to decoder 670:

$$\Lambda_{ldpc,a}^{j+1}(x_i) = \begin{cases} \Lambda_{ch,ext}^{j}(x_i), & \text{where defect flag 620 does not indicate a defect} \\ \beta \cdot z_i + \alpha \cdot \Lambda_{ldpc,ext}^{j}(x_i), & \text{where defect flag 620 indicates a defect.} \end{cases}$$

It should be noted that regardless of whether output 625, output 630, or the output of soft LLR estimator 665 is chosen to drive extrinsic LLR 645, decoder 670 may apply the same decoding process. In some cases, the decoding process is a standard LDPC decoding process.

Figure 7:
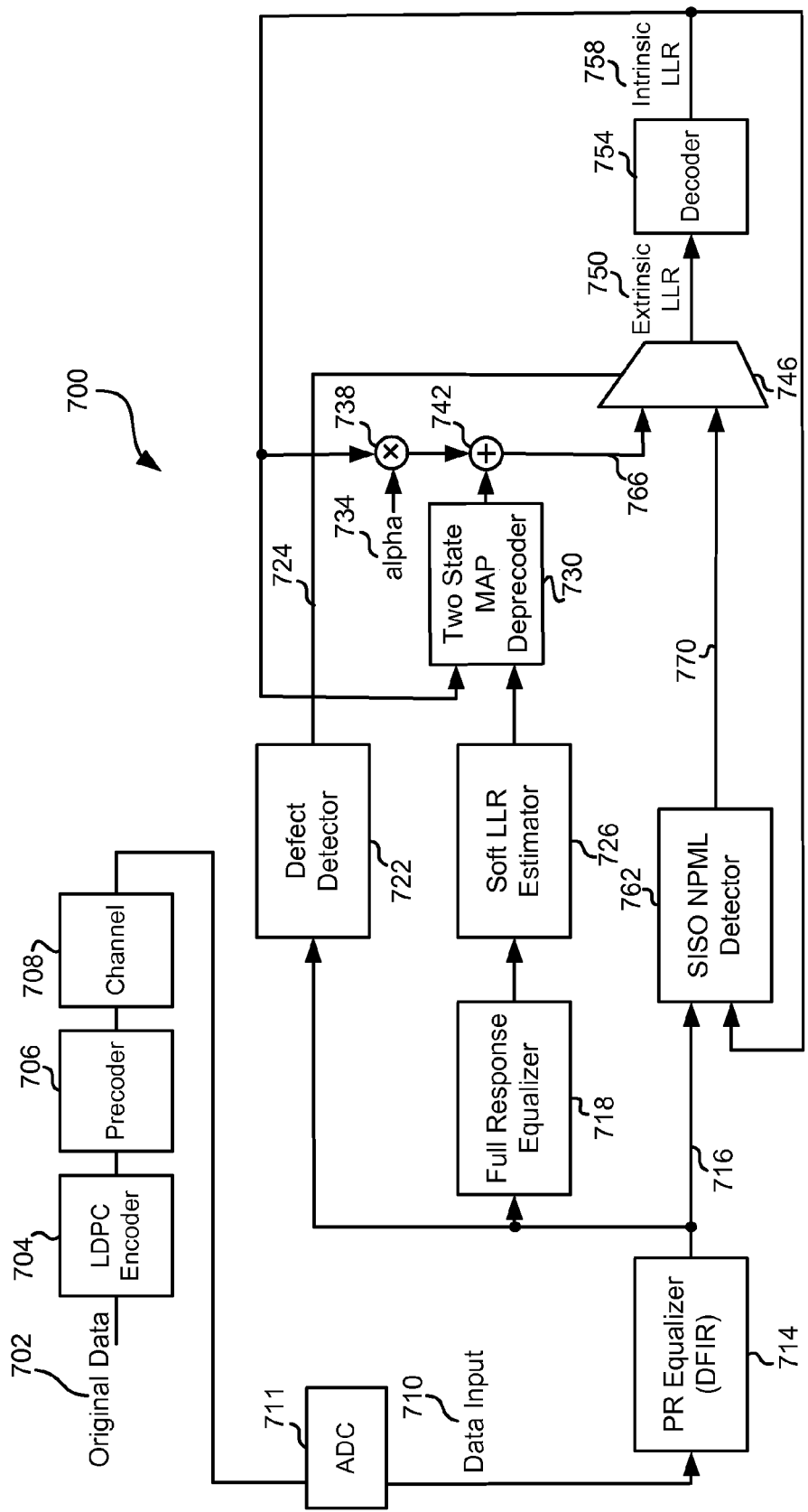
FIG. 7 depicts another data regeneration system in accordance with other embodiments of the present invention.

Turning to FIG. 7, another data regeneration system 700 operating on a precoded channel is depicted in accordance with other embodiments of the present invention. Data regeneration system 700 includes an original data input 702 that is provided to an encoder 704 where it is encoded as is known in the art. In one case, encoder 704 is an LDPC encoder. The encoded data is then precoded by a precoder 706. In one particular embodiment of the present invention, precoder 706 applies a 1/(1+D) precoding to the received encoded data. The precoded data is provided to a channel 708 from which a data input 710 is derived. Channel 708 may be any medium by which information is transferred including, but not limited to, a magnetic storage medium, a atmosphere through which signals are transferred, an electrically or optically conductive material by which signals may be transferred or the like. Based on the disclosure provided herein, one of ordinary skill in the art will recognize a variety of media that may comprise channel 708.

Data input 710 may be converted using an analog to digital converter 711. Data input 710 is provided to a PR equalizer 714 as is known in the art. PR equalizer 714 may be implemented as a DFIR. An output 716 from PR equalizer 714 is provided to a defect detector 722 that may be operable to determine that a medium (i.e., channel 708) from which data input 710 is derived has a defective area, region or time period. When a defective portion is detected, defect detector 722 asserts a media defect flag 724 that controls selection of a multiplexer 746. Multiplexer 746 provides an extrinsic LLR 750 to a decoder 754. Decoder 754 provides a decoding process that is complementary to encoder 704. In some cases, decoder 754 is an LDPC decoder as is known in the art. In particular, when media defect flag 724 is asserted such that a defective portion of a medium from which data input 710 is indicated, an output 766 is selected. In contrast, when media defect flag 724 is asserted such that a media defect is not indicated, output 770 is selected.

As some examples, defect detector 722 may be defect detector similar to those disclosed in PCT Patent Application No. PCT/US07/80043 entitled "Systems and Methods for Media Defect Detection" and filed on Oct. 1, 2007 by Agere Systems Inc. The entirety of the aforementioned patent application was previously incorporated herein by reference for all purposes. It should be noted that other types a media defect detection may be used in relation to the various embodiments of the present invention.

Output 770 is driven by a soft output detector 762 as are known in the art, and output 766 are driven by a full response equalizer 718 that may be similar to those described above. In one particular embodiment of the present invention, full response equalizer 718 is a 6-tap FIR filter. An output 716 of PR equalizer 714 is provided to both soft output detector 762 and full response equalizer 718. Soft output detector 762 performs a detection algorithm on the received input and provides output 770 as is known in the art. Output 770 provides at least a soft indication of original data 702 that was previously encoded and from which data input 710 is derived. When the medium from which data input 710 is derived is non-defective, output 770 provides a reasonably accurate representation of the originally encoded data. In contrast, when the medium from which data input 710 is derived is defective, output 770 becomes less accurate and in some cases the decreased accuracy results in an inability for decoder 754 to operate properly. An intrinsic LLR output 758 from decoder 754 is fed back to soft output detector 762 to allow for iterative processing.

As the inaccuracy of output 770 becomes problematic for decoder 754 during times when a media defect is detected, output 766 is selected to drive extrinsic LLR 750 during such times. Output 766 is driven by a separate, parallel data path providing full response equalization. In particular, full response equalizer 718 performs an equalization on output 716 that yields useful polarity information by removing intersymbol interference. The output of full response equalizer 718 is provided to a soft LLR estimator 726 that is used to convert the equalized samples from full response equalizer 718 to an LLR. In some cases, soft LLR estimator 726 is a scalar $\beta$ that scales an input $z_i$ down to obtain an output $\Lambda_i$. Said another way, soft LLR estimator 726 provides a soft output comparable to that provided by soft output detector 726, albeit a soft output indicating a generally reduced probability of accuracy when compared with that available from soft output detector 762 when a media defect is not indicated. In some cases, the output from soft LLR estimator 726 may be provided directly to multiplexer 746 to be used in place of output 770 when a media defect is detected.

In contrast to the non-coded channel approach, in the precoded channel, soft output detector 762 only provides LLRs for the data before precoder 706. However, full response equalizer 718 operates on the data after precoder 706. Thus, soft LLR estimator 726 only provides LLRs for bits corresponding to a media defect region after precoder 706. Decoder 754 receives LLRs for the data before precoder 706 as an input. Thus, an LLR converter is used to convert the LLRs from after precoder 706 to before precoder 706. Data before precoder 706 is referred to as $u_i$, and data after precoder 706 is referred to as $x_i$. Using this convention, after full-response equalizer 718 and soft LLR estimator 726, it is necessary to convert $\Lambda_a(x_i)$ to $\Lambda_a(u_i)$.

A method for performing the above mentioned conversion utilizes a two state MAP deprecoder 730. Two state MAP deprecoder 730 may be, for example, a standard soft output convolutional code decoder. Two state MAP deprecoder 730 takes soft inputs from soft LLR estimator 726 (i.e., $\Lambda_a(x_i)$) and from decoder 754 (i.e., $\Lambda_a(u_i)$), and generates soft outputs $\Lambda_{ext}(u_i)$ (and $\Lambda_{ext}(x_i)$ but not needed). Two state MAP deprecoder 730 may have a very low complexity compared with the complexity of detector 762 as it may only demand two states corresponding to precoder 706 where precoder 706 implements 1/(1+D). Two state MAP deprecoder 730 does not exhibit any data dependency and therefore does not have noise prediction. Further, two state MAP deprecoder 730 does not take channel input in its branch metric. In other words, the branch metric only handles soft inputs $\Lambda_a(x_i)$ and $\Lambda_a(u_i)$.

In some cases, the output of two state MAP deprecoder 730 is provided directly to multiplexer 746 as input 766. In other cases, the output of two state MAP deprecoder 730 is further enhanced using intrinsic LLR 758 that is multiplied using a multiplier (alpha) 734 using a multiplier 738. The result of the multiplication is summed with the output of two state MAP deprecoder 730 using an adder 742. The output of adder 742 is provided as output 766. In such case, extrinsic LLR 750 is defined by the following equation:

$$\Lambda_{ldpc,a}^{j+1}(x_i) = \begin{cases} \Lambda_{ch,ext}^j(u_i), & \text{for non-}MDbits \\ \text{map2}(\beta \cdot z_i, \Lambda_{ldpc,ext}^j(u_i)) + \alpha \cdot \Lambda_{ldpc,ext}^j(u_i), & \text{for }MDbits \end{cases},$$

where map2( ) represents the function of two state MAP deprecoder 730.

Figure 8:
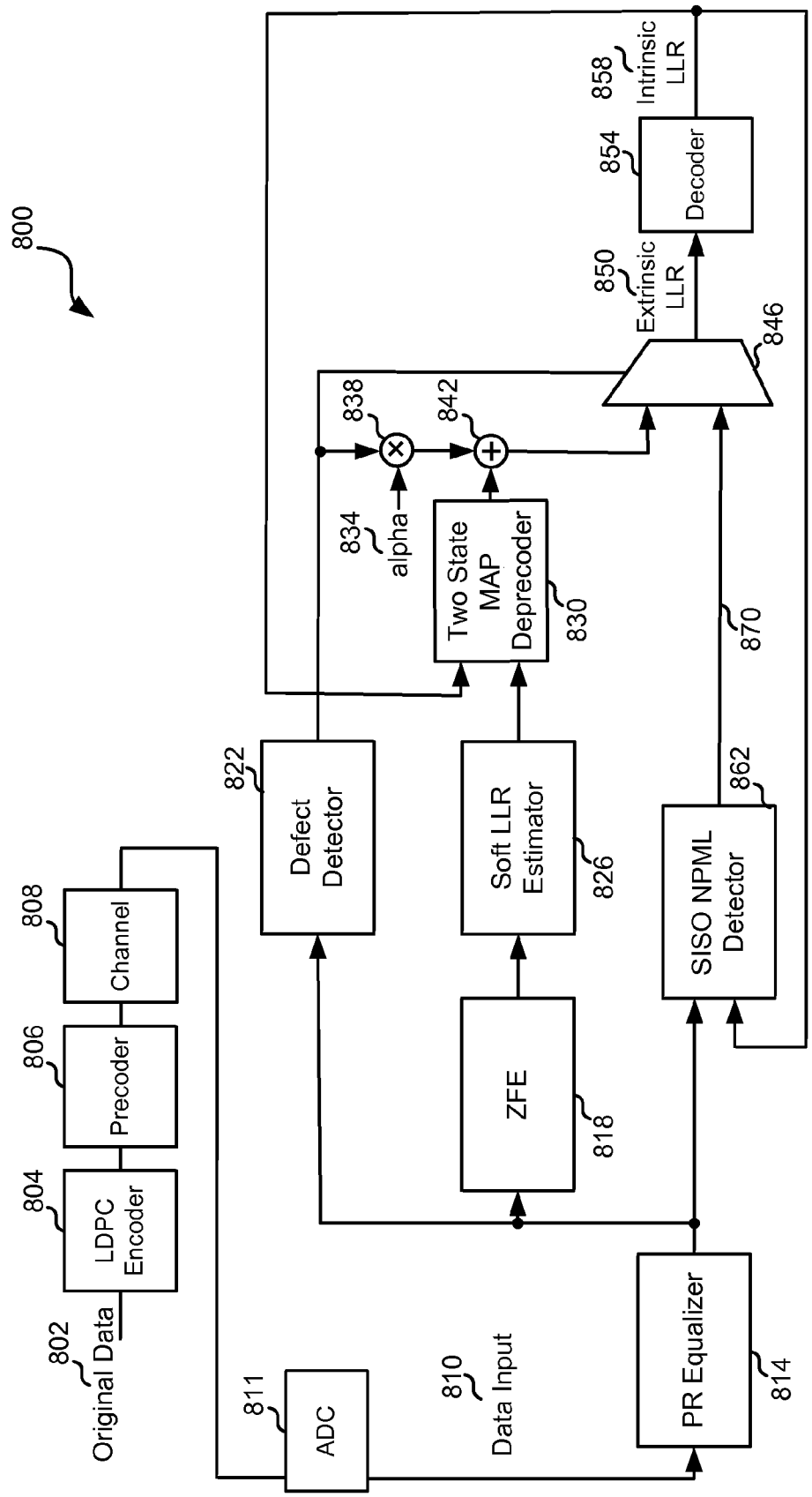
FIG. 8 depicts yet another data regeneration system in accordance with yet other embodiments of the present invention.

Turning to FIG. 8, yet another data regeneration system 800 operating on a precoded channel is depicted in accordance with other embodiments of the present invention. Data regeneration system 800 includes an original data input 802 that is provided to an encoder 804 where it is encoded as is known in the art. In one case, encoder 804 is an LDPC encoder. The encoded data is then precoded by a precoder 806. In one particular embodiment of the present invention, precoder 806 applies a 1/(1+D) precoding to the received encoded data. The precoded data is provided to a channel 808 from which a data input 810 is derived. Channel 808 may be any medium by which information is transferred including, but not limited to, a magnetic storage medium, a atmosphere through which signals are transferred, an electrically or optically conductive material by which signals may be transferred or the like. Based on the disclosure provided herein, one of ordinary skill in the art will recognize a variety of media that may comprise channel 808.

Data input 810 is received after being converted using an analog to digital converter 811. Data input 810 is provided to a PR equalizer 814 as is known in the art. The output of PR equalizer 814 is provided to a zero force equalizer 818, a detector 862 and to a defect detector 822. Defect detector 822 may be operable to determine that a medium (i.e., channel 808) from which data input 810 is derived has a defective area, region or time period. When a defective portion is detected, defect detector 822 asserts a media defect flag 824 that controls selection of a multiplexer 846. Multiplexer 846 provides an extrinsic LLR 850 to a decoder 854. Decoder 854 provides a decoding process that is complementary to encoder 804. In some cases, decoder 854 is an LDPC decoder as is known in the art. In particular, when media defect flag 824 is asserted such that a defective portion of a medium from which data input 810 is indicated, an output 866 is selected. In contrast, when media defect flag 824 is asserted such that a media defect is not indicated, output 870 is selected.

As some examples, defect detector 822 may be defect detector similar to those disclosed in PCT Patent Application No. PCT/US07/80043 entitled "Systems and Methods for Media Defect Detection" and filed on Oct. 1, 2007 by Agere Systems Inc. The entirety of the aforementioned patent application was previously incorporated herein by reference for all purposes. It should be noted that other types a media defect detection may be used in relation to the various embodiments of the present invention.

Output 870 is driven by a soft output detector 862 as are known in the art, and output 866 are driven by a zero force equalizer 818 that may be similar to those described above. An output 816 of PR equalizer 814 is provided to both soft output detector 862 and zero force equalizer 818. Soft output detector 862 performs a detection algorithm on the received input and provides output 870 as is known in the art. Output 870 provides at least a soft indication of original data 802 that was previously encoded and from which data input 810 is derived. When the medium from which data input 810 is derived is non-defective, output 870 provides a reasonably accurate representation of the originally encoded data. In contrast, when the medium from which data input 810 is derived is defective, output 870 becomes less accurate and in some cases the decreased accuracy results in an inability for decoder 854 to operate properly. An intrinsic LLR output 858 from decoder 854 is fed back to soft output detector 862 to allow for iterative processing.

As the inaccuracy of output 870 becomes problematic for decoder 854 during times when a media defect is detected, output 866 is selected to drive extrinsic LLR 850 during such times. Output 866 is driven by a separate, parallel data path providing full response equalization. In particular, zero force equalizer 818 performs an equalization on output 816 that yields useful polarity information by removing inter-symbol interference. The output of zero force equalizer 818 is provided to a soft LLR estimator 826 that is used to convert the equalized samples from zero force equalizer 818 to an LLR. In some cases, soft LLR estimator 826 is a scalar $\beta$ that scales an input $z_i$ down to obtain an output $\Lambda_i$. Said another way, soft LLR estimator 826 provides a soft output comparable to that provided by soft output detector 826, albeit a soft output indicating a generally reduced probability of accuracy when compared with that available from soft output detector 862 when a media defect is not indicated. In some cases, the output from soft LLR estimator 826 may be provided directly to multiplexer 846 to be used in place of output 870 when a media defect is detected.

In contrast to the non-coded channel approach, in the pre-coded channel, soft output detector 862 only provides LLRs for the data before precoder 806. However, zero force equalizer 818 operates on the data after precoder 806. Thus, soft LLR estimator 826 only provides LLRs for bits corresponding to a media defect region after precoder 806. Decoder 854 receives LLRs for the data before precoder 806 as an input. Thus, an LLR converter is used to convert the LLRs from after precoder 806 to before precoder 806. Data before precoder 806 is referred to as $u_i$, and data after precoder 806 is referred to as $x_i$. Using this convention, after full-response equalizer 818 and soft LLR estimator 826, it is necessary to convert $\Lambda_a(x_i)$ to $\Lambda_a(u_i)$.

A method for performing the above mentioned conversion utilizes a two state MAP deprecoder 830. Two state MAP deprecoder 830 may be, for example, a standard soft output convolutional code decoder. Two state MAP deprecoder 830 takes soft inputs from soft LLR estimator 826 (i.e., $\Lambda_a(x_i)$) and from decoder 854 (i.e., $\Lambda_a(u_i)$), and generates soft outputs $\Lambda_{ext}(u_i)$ (and $\Lambda_{ext}(x_i)$ but not needed). Two state MAP deprecoder 830 may have a very low complexity compared with the complexity of detector 862 as it may only demand two states corresponding to precoder 806 where precoder 806 implements 1/(1+D). Two state MAP deprecoder 830 does not exhibit any data dependency and therefore does not have noise prediction. Further, two state MAP deprecoder 830 does not take channel input in its branch metric. In other words, the branch metric only handles soft inputs $\Lambda_a(x_i)$ and $\Lambda_a(u_i)$.

In some cases, the output of two state MAP deprecoder 830 is provided directly to multiplexer 846 as input 866. In other cases, the output of two state MAP deprecoder 830 is further enhanced using intrinsic LLR 858 that is multiplied using a multiplier (alpha) 834 using a multiplier 838. The result of the multiplication is summed with the output of two state MAP deprecoder 830 using an adder 842. The output of adder 842 is provided as output 866. In such case, extrinsic LLR 750 is defined by the following equation:

$$\Lambda_{ldpc,a}^{j+1}(x_i) = \begin{cases} \Lambda_{ch,ext}^{j}(u_i), & \text{for non-}MDbits \\ \text{map2}(\beta \cdot z_i, \Lambda_{ldpc,ext}^{j}(u_i)) + \alpha \cdot \Lambda_{ldpc,ext}^{j}(u_i), & \text{for }MDbits \end{cases},$$

where map2( ) represents the function of two state MAP deprecoder 830.

Figure 9:
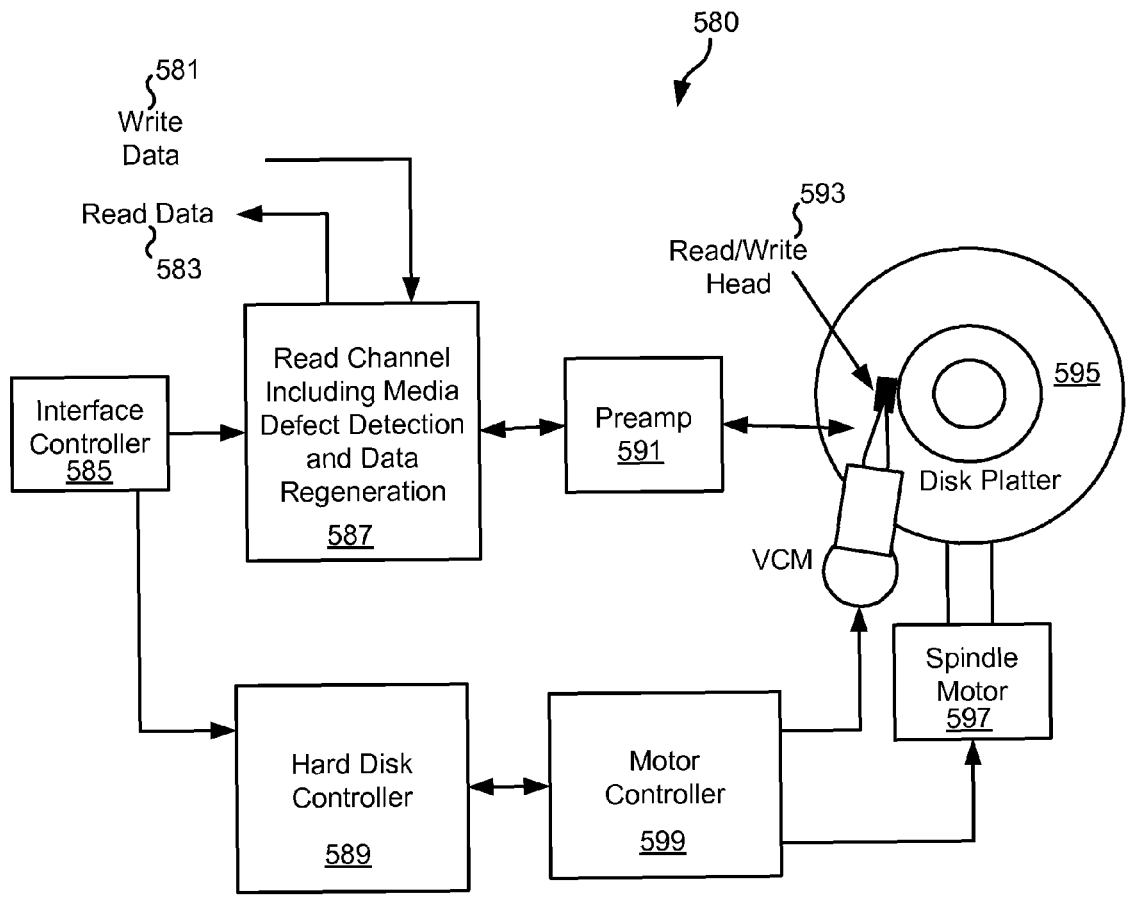
FIG. 9 shows a storage system including a media defect detection and data regeneration system in accordance with various embodiments of the present invention.

Turning to FIG. 9, a storage system 580 including a media defect and data regeneration system 587 is shown in accordance with various embodiments of the present invention. Storage system 580 may be, for example, a hard disk drive. Storage system 580 includes a read channel 587 with an incorporated media defect detector and data regeneration system. The incorporated media defect detector may be any media defect detector capable of detecting a defect on a disk platter 595, and the data regeneration system may be any system capable of recovering at least polarity data from a defective region of disk platter 595. Thus, for example, read channel 587 may incorporate a media defect detector and data regeneration system similar to those discussed above in relation to FIGS. 5-8. In addition, storage system 580 includes an interface controller 585, a preamp 591, a hard disk controller 589, a motor controller 599, a spindle motor 597, a disk platter 595, and a read/write head 593. Interface controller 585 controls addressing and timing of data to/from disk platter 595. The data on disk platter 595 consists of groups of magnetic signals that may be detected by read/write head assembly 593 when the assembly is properly positioned over disk platter 595. In a typical read operation, read/write head assembly 593 is accurately positioned by motor controller 599 over a desired data track on disk platter 595. Motor controller 599 both positions read/write head assembly 593 in relation to disk platter 595 and drives spindle motor 597 by moving read/write head assembly to the proper disk track on disk platter 595 under the direction of hard disk controller 589. Spindle motor 597 spins disk platter 595 at a determined spin rate (RPMs).

Once read/write head assembly 593 is positioned adjacent the proper data track, magnetic signals representing data on disk platter 595 are sensed by read/write head assembly 593 as disk platter 595 is rotated by spindle motor 597. The sensed magnetic signals are provided as a continuous, minute analog signal representative of the magnetic data on disk platter 595. This minute analog signal is transferred from read/write head assembly 593 to read channel module 587 via preamp 591. Preamp 591 is operable to amplify the minute analog signals accessed from disk platter 595. In addition, preamp 591 is operable to amplify data from read channel module 587 that is destined to be written to disk platter 595. In turn, read channel module 587 decodes (including media defect detection) and digitizes the received analog signal to recreate the information originally written to disk platter 595. This data is provided as read data 583 to a receiving circuit. A write operation is substantially the opposite of the preceding read operation with write data 581 being provided to read channel module 587. This data is then encoded and written to disk platter 595.

Figure 10:
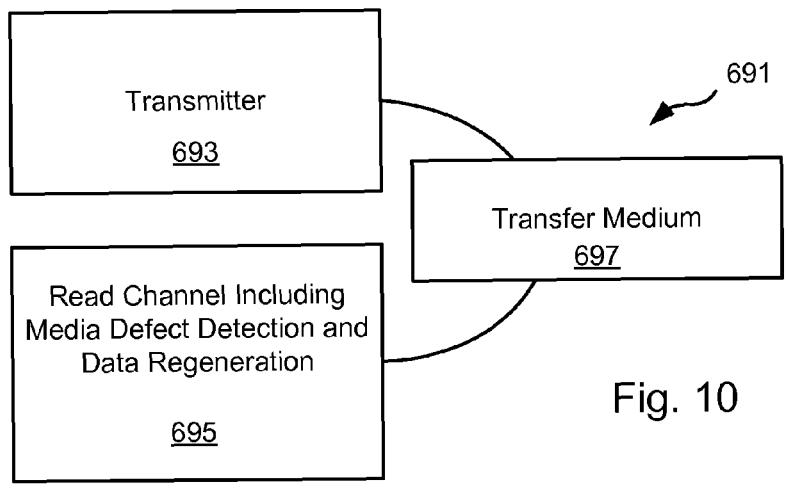
FIG. 10 depicts a communication system including a media defect detection and data regeneration system in accordance with one or more embodiments of the present invention.

Turning to FIG. 10, a communication system 691 including a receiver 695 with a media defect and data regeneration system in accordance with one or more embodiments of the present invention is shown. Communication system 691 includes a transmitter 693 that is operable to transmit encoded information via a transfer medium 697 as is known in the art. The encoded data is received from transfer medium 697 by receiver 695. Receiver 695 incorporates a media defect detection circuit that is operable to determine whether a "defect" has occurred in transfer medium 697, and to recover at least some level of data from the defective time period or portion of transfer medium 697. Thus, for example, where transfer medium 697 is a wire, it may determine that no signal is being received or that a disruptive level of interference is ongoing. Alternatively, where transfer medium 697 is the atmosphere carrying wireless signals, the media defect detection circuit may indicate a very noisy and unreliable transfer environment. Based on the disclosure provided herein, one of ordinary skill in the art will recognize a variety of mediums that may include defects and that may be utilized in relation to different embodiments of the present invention. The incorporated media defect detector and data regeneration system may be one such as those discussed above in relation to FIGS. 5-8.

Figure 1:
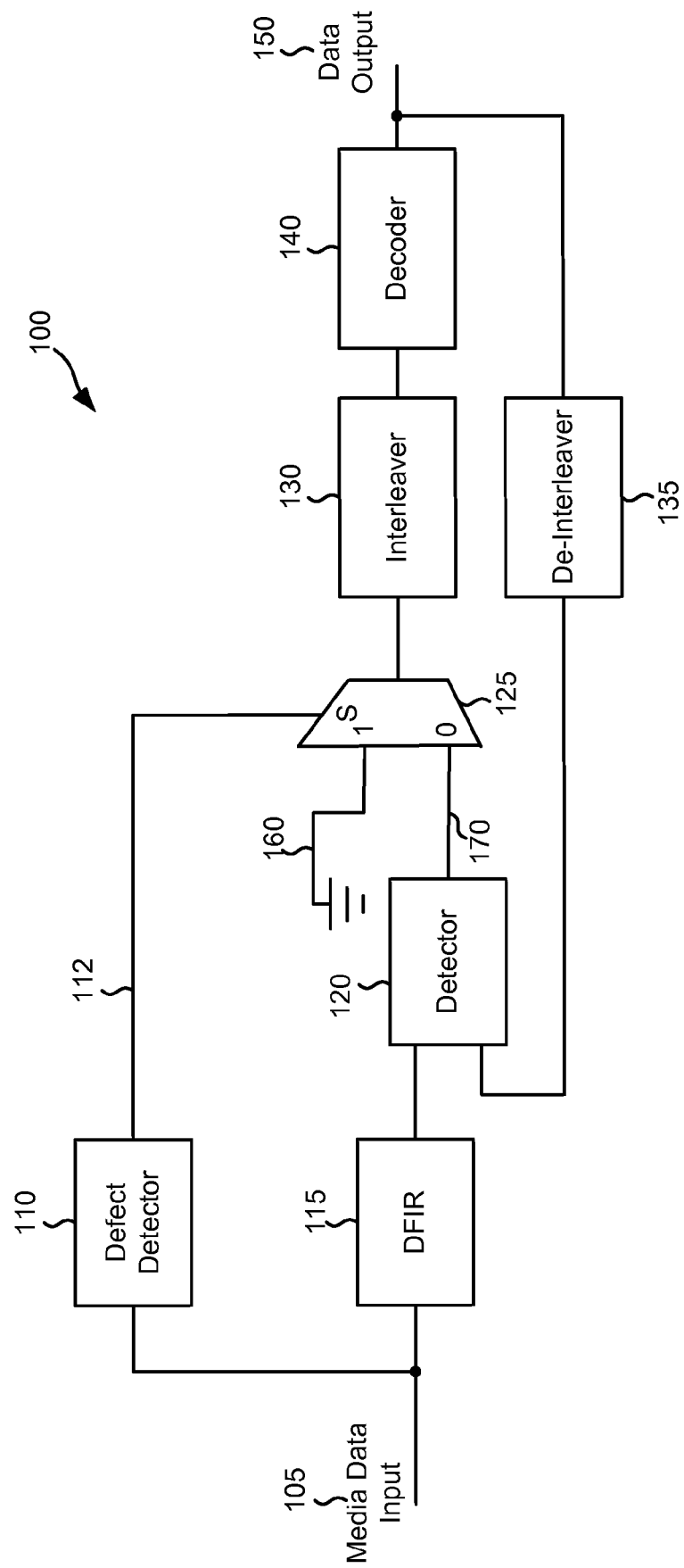
FIG. 1 a prior art data cancellation system.

It should be noted that the feed back of intrinsic LLR data to regenerate a signal derived from a defective portion of a medium may be used in relation to a number of different data recovery systems and not just those described in FIGS. 5-8. For example, the data erasure system of FIG. 1 could be modified to use intrinsic LLR data to be applied to the multiplexer in place of the ground as shown. This allows the system of FIG. 1 to become a data recovery system. Based on the disclosure provided herein, one of ordinary skill in the art will recognize other situations where a data recovery/data erasure system may be enhanced by the feedback of intrinsic LLR data.

Figure 11:
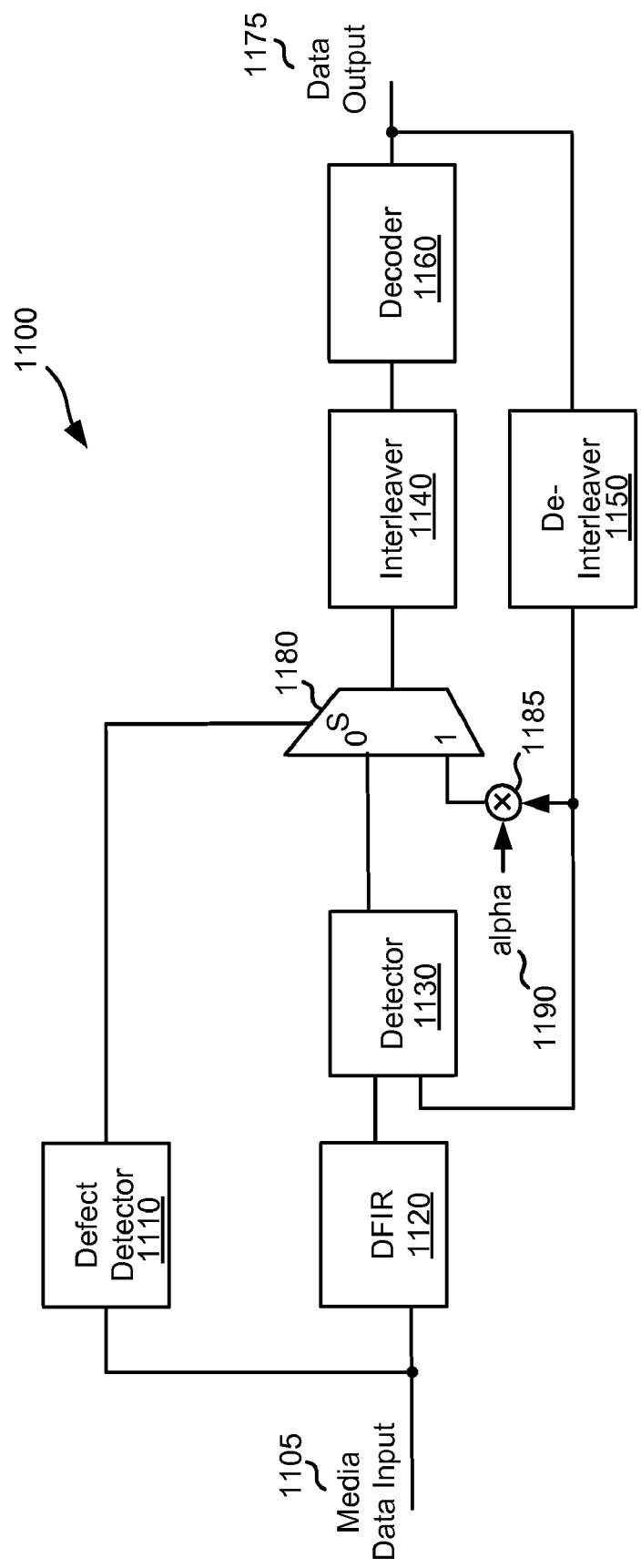
FIGS. 11-12 depict yet another data regeneration systems in accordance with some embodiments of the present invention.

Turning to FIG. 11, another data regeneration system 1100 is depicted in accordance with other embodiments of the present invention. Data regeneration system 1100 includes a DFIR 1120 and a media defect detector 1110 that each receive a media data input 1105. The output of DFIR 1120 is provided to a detector 1130. Detector 1130 may be, but is not limited to, a soft output Viterbi algorithm detector or a maximum a posteriori algorithm detector. The output of detector 1130 is provided as an input to a multiplexer 1180. The output of multiplexer 1140 is provided to an interleaver 1140. The output of interleaver 1140 is provided to a decoder 1160. The output of decoder 1160 is fed back through a de-interleaver 1150 to detector 1130. In addition, the output of de-interleaver 1150 is multiplied by a value alpha 1190 using a multiplier 1185 and provided as another input to multiplexer 1180.

In operation, when a media defect is detected by media defect detector 1110, the output of multiplier 1185 is selected to drive interleaver 1140. In contrast, when a defect is not indicated by media defect detector 1110, the output of detector 1130 is selected to drive interleaver. On the first iteration, data regeneration system 1100 operates consistent with that described in FIG. 1 as no data is yet available, but on later iterations regenerated data is provided to the of multiplexer 1180 from multiplier 1185. The following pseudo code represents the output provided to interleaver 1140 depending upon whether a media defect is indicated:

```
IF (Media Defect Flag Indicates no Defect)
{
Output = (NPFIR*y-ideal)² + soft input
}
ELSE IF (Media Defect Flag Indicates a Defect)
{
Output = (1+alpha)*soft input
},
```

Where NPFIR refers to the output of a noise predictive FIR filter.

Figure 12:
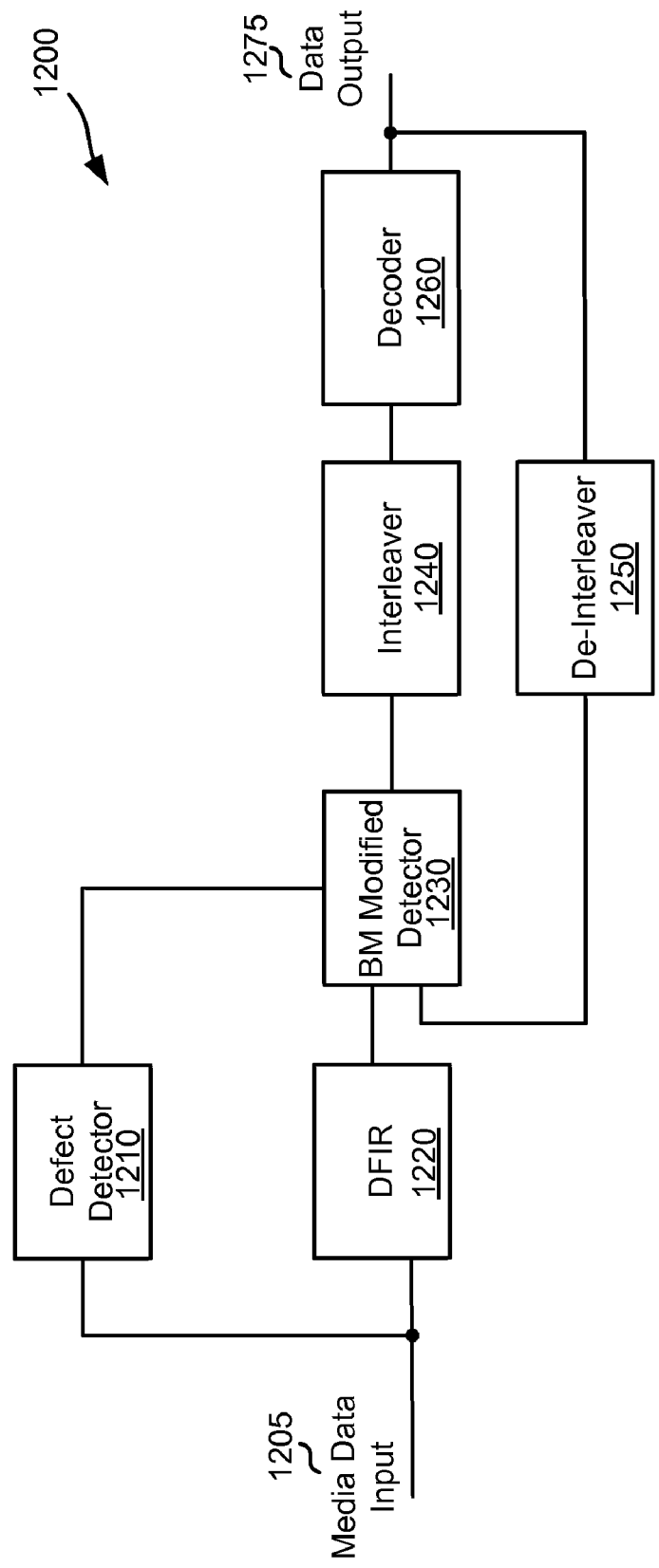

Turning to FIG. 12, yet another data regeneration system 1200 is shown in accordance with yet other embodiments of the present invention. Data regeneration system 1200 includes a DFIR 1220 and a media defect detector 1210 that each receive a media data input 1205. The output of DFIR 1220 is provided to a branch metric modified detector 1230. Branch metric modified detector 1230 may be, but is not limited to, a soft output Viterbi algorithm detector or a maximum a posteriori algorithm detector. The output of branch metric modified detector 1230 is provided to an interleaver 1240. The output of interleaver 1240 is provided to a decoder 1260, and the output of decoder 1260 is fed back to branch metric modified detector 1230.

In operation, when a media defect is detected by media defect detector 1210, the branch metric of branch metric modified detector 1230 is modified to be: (1+alpha)*soft input. Otherwise, when no media defect is detected by media defect detector 1210, the following standard branch metric is used by branch metric modified detector 1230: (NPFIR*y-ideal)²+soft input. Thus, data regeneration system 1200 is mathematically equivalent to data regeneration system 1100 discussed above.

In conclusion, the invention provides novel systems, devices, methods and arrangements for regenerating data derived from a defective medium. While detailed descriptions of one or more embodiments of the invention have been given above, various alternatives, modifications, and equivalents will be apparent to those skilled in the art without varying from the spirit of the invention. For example, one or more embodiments of the present invention may be applied to various data storage systems and digital communication systems, such as, for example, tape recording systems, optical disk drives, wireless systems, and digital subscribe line systems. Therefore, the above description should not be taken as limiting the scope of the invention, which is defined by the appended claims.

What is claimed is:

1. A method for regenerating data derived from a defective portion of a medium, the method comprising:
   receiving a data input derived from a medium;
   performing a data detection based at least in part on the data input, wherein a first soft output is generated;
   determining a defect status of the medium;
   based at least in part on the defect status, decoding a regenerated signal in place of the first soft output, and wherein the decoding process produces a second soft output; and
   producing the regenerated signal, wherein the regenerated signal includes the second soft output multiplied by a scalar.

2. The method of claim 1, wherein decoding the regenerated signal includes interleaving the regenerated signal to produce an interleaved first soft output, decoding the interleaved first soft output to created a decoded output, and de-interleaving the decoded output to produce the second soft output.

3. The method of claim 1, wherein determining the defect status includes providing a defect output, and wherein decoding the regenerated signal in place of the first soft output includes applying the defect output to an input control of a multiplexer.

4. The method of claim 1, wherein determining the defect status includes providing a defect output, wherein performing the data detection is done using a branch metric modified data detector; wherein the branch metric modified data detector receives the data input and the defect output; wherein the branch metric modified data detector utilizes a first branch metric whenever the defect output indicates a non-defective portion of the medium associated with the data input; and wherein the branch metric modified data detector utilizes a second branch metric whenever the defect output indicates a defective portion of the medium associated with the data input.

5. The method of claim 4, wherein the second branch metric corresponds to the regenerated signal.

6. The method of claim 5, wherein the second branch metric is mathematically (1 +the scalar)*(the second soft output).

7. The method of claim 1, wherein the data input is a pre-coded data input.

8. The method of claim 7, wherein decoding the regenerated signal includes performing a two-state MAP depredecoding, and wherein the two-state MAP deprecoding utilizes the second soft output.

9. The method of claim 1, wherein the medium is selected from a group consisting of: a magnetic storage medium, a wireless communication channel, and a wired communication channel.

10. A system for regenerating data derived from a defective portion of a medium, the system comprising:
    a data detector, wherein the data detector is operable to receive a data input derived from a medium and to provide a first soft output;
    a decoder, wherein the decoder is operable to decode a second soft output and to generate a third soft output;
    a data regeneration system, wherein the data regeneration system is operable to multiply the third soft output by a scalar to create a fourth soft output;
    a media defect detector, wherein the media defect detector is operable to receive the data input and to provide a defect flag indicative of a defect status of the medium; and
    an input selector, wherein the input selector is operable to provide either the first soft output or the fourth soft output as the second soft output based at least in part on the defect flag.

11. The system of claim 10, wherein the decoder includes an interleaver that is operable to interleave the second soft output to produce an interleaved second soft output; a decoding circuit that is operable to receive the interleaved second soft output and to create a decoded output; and a de-interleaver that is operable to de-interleave the decoded output and to provide the third soft output.

12. The system of claim 10, wherein the input selector is a multiplexer, and wherein the select control of the multiplexer is driven by the defect flag.

13. The system of claim 10, wherein the data detector, the data regeneration system and the input selector are implemented together as a branch metric modified data detector, wherein the branch metric modified data detector is operable to receive the data input and the defect flag; and wherein the branch metric modified data detector is operable to utilize the fourth soft output as a branch metric whenever the defect flag indicates a defective portion of the medium associated with the data input.

14. The system of claim 13, wherein the branch metric is mathematically (1 +the scalar)*(the third soft output).

15. The system of claim 14, wherein the branch metric modified data detector is operable to utilize the first soft output in place of the branch metric whenever the defect flag indicates a non-defective portion of the medium associated with the data input.

16. The system of claim 10, wherein the system further includes a precoder, and wherein the data input is precoded by the precoder.

17. The system of claim 16, wherein the system further includes a deprecoder, and wherein the deprecoder is operable to augment the fourth soft output.

18. The system of claim 17, wherein the deprecoder is a two state MAP deprecoder.

19. The system of claim 10, wherein the medium is selected from a group consisting of: a magnetic storage medium, a wireless communication channel, and a wired communication channel.

20. The system of claim 10, wherein the system is implemented as part of a device selected from a group consisting of: a storage device; a wireless communication device, and a wired communication device.

21. The system of claim 10, wherein the system is implemented as part of a storage device, and wherein the system further comprises:
    a read/write head disposed in relation to the storage medium and operable to provide an input signal corresponding to information from the storage medium; and
    wherein the data input is derived from the input signal.

22. The system of claim 10, wherein the system is implemented as part of an integrated circuit.

23. The system of claim 10, wherein the data detected is selected from a group consisting of: a Viterbi algorithm detector, a maximum a posterior algorithm detector, and a noise predictive maximum likelihood detector.

24. The system of claim 10, wherein the data decoder is a low density parity check decoder.

25. A circuit for regenerating data derived from a defective portion of a medium, the circuit comprising:

a decoder circuit, wherein the decoder circuit is operable to decode an intrinsic input and to generate an extrinsic output;

a data detector circuit operable to receive a data input derived from a medium and to generate a first soft output based at least in part on the data input;

a data recovery circuit operable to receive the data input and the intrinsic input; wherein the data recovery circuit includes an equalizer circuit, a soft estimator circuit, and intrinsic scaling circuit; wherein the equalizer circuit is operable to provide an equalized output indicating a polarity of the data input; wherein the soft estimator circuit is operable to receive the equalized output and to provide a second soft output based at least in part on the equalized output; and wherein the intrinsic scaling circuit includes a multiplier that is operable to multiply the intrinsic input with a scalar value to create an output scalar, and an adder that is operable to sum the second soft output with the output scalar to generate a third soft output; and a multiplexer, wherein the multiplexer is operable to provide either the first soft output or the third soft output as the extrinsic output based at least in part on an indication of a defect in the medium.

26. The circuit of claim 25, wherein the circuit is incorporated as part of a device selected from a group consisting of: a storage device; a wireless communication device, and a wired communication device.

27. The circuit of claim 26, wherein the circuit is incorporated as part of a storage device, and wherein the storage device comprises:

a read/write head disposed in relation to the storage medium and operable to provide an input signal corresponding to information from the storage medium; and wherein the data input is derived from the input signal.

28. The circuit of claim 25, wherein the data detected is selected from a group consisting of: a Viterbi algorithm detector, a maximum a posterior algorithm detector, and a noise predictive maximum likelihood detector.

29. The Circuit of claim 25, wherein the data decoder is a low density parity check decoder.

30. A system for regenerating data derived from a defective portion of a medium, the system comprising:

a media defect detector operable to receive a first data input derived from a medium and to provide a defect flag indicative of a defect status of the medium;

a data detector operable to apply a data detection algorithm to a second data input derived from the medium to yield a first soft output;

a decoder operable to apply a data decode algorithm to a decoder input to yield a second soft output;

a data regeneration system operable to modify the second soft output to yield a third soft output; and an input selector operable to provide either the first soft output or the third soft output as the decoder input based at least in part on the defect flag.

31. The system of claim 30, wherein the first data input and the second data input are the same.

32. The system of claim 30, wherein modifying the second soft output to yield the third soft output includes:

multiplying the second soft output by a value to yield an interim output; and adding the interim output to an estimated soft output to yield the third soft output.

33. The system of claim 30, wherein the input selector is a multiplexer, and wherein the select control of the multiplexer is driven by the defect flag.

34. The system of claim 30, wherein the data detector, the data regeneration system and the input selector are implemented together as a branch metric modified data detector, wherein the branch metric modified data detector is operable to receive the data input and the defect flag; and wherein the branch metric modified data detector is operable to utilize the third soft output as a branch metric whenever the defect flag indicates a defective portion of the medium associated with the data input.

35. The system of claim 34, wherein the branch metric modified data detector is operable to utilize the first soft output in place of the branch metric whenever the defect flag indicates a non-defective portion of the medium associated with the data input.

36. The system of claim 30, wherein the system is implemented as part of a device selected from a group consisting of: a storage device; a wireless communication device, and a wired communication device.

37. The system of claim 30, wherein the system is implemented as part of an integrated circuit.

38. The system of claim 30, wherein the data detected is selected from a group consisting of: a Viterbi algorithm detector, a maximum a posterior algorithm detector, and a noise predictive maximum likelihood detector.

39. The system of claim 30, wherein the data decoder is a low density parity check decoder.

* * * * *